US006701476B2

(12) United States Patent
Pouya et al.

(10) Patent No.: US 6,701,476 B2
(45) Date of Patent: Mar. 2, 2004

(54) TEST ACCESS MECHANISM FOR SUPPORTING A CONFIGURABLE BUILT-IN SELF-TEST CIRCUIT AND METHOD THEREOF

(75) Inventors: Bahram Pouya, Austin, TX (US); Alfred L. Crouch, Cedar Park, TX (US); Gregory Dean Young, Georgetown, TX (US); Jeffrey L. Freeman, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 293 days.

(21) Appl. No.: 09/870,205

(22) Filed: May 29, 2001

(65) Prior Publication Data

US 2002/0184582 A1 Dec. 5, 2002

(51) Int. Cl.[7] ............................................. G01R 31/28
(52) U.S. Cl. ........................ 714/727; 714/729; 714/731
(58) Field of Search ................................ 714/727, 731, 714/729

(56) References Cited

U.S. PATENT DOCUMENTS

| | | | |
|---|---|---|---|
| 4,969,148 A | 11/1990 | Nadeau-Dostie et al. | 371/21.1 |
| 5,056,094 A | * 10/1991 | Whetsel | 714/736 |
| 5,748,497 A | * 5/1998 | Scott et al. | 702/181 |
| 5,889,788 A | 3/1999 | Pressly et al. | 371/22.31 |
| 5,991,909 A | * 11/1999 | Rajski et al. | 714/729 |

OTHER PUBLICATIONS

Stroele et al., "Hardware–Optimal Test Register Insertion," IEEE Transactions on Computer–Aided Design of Integrated Circuits and Systems, vol. 17, No. 6, Jun. 1998, pp. 531–539.

Abdulla et al., "Hybrid Testing Schemes Based on Mutual and Signature Testing," IEEE, pp. 293–296 (1997).

Petlin et al., "Built–In Self–Testing of Micropipelines," IEEE, pp. 22–29 (1997).

Abdulla et al., "A Novel BIST Architecture With Built–in Self Check," 9th International Conference on VLSI Design, IEEE, pp. 57–60 (1995).

Lin et al., "Generating a Family of Testable Designs Using the BILBO Methodology*," Journal of Electronic Testing: Theory and Applications, 4, pp. 71–89 (1993).

Abramovici et al., "Digital Systems Testing and Testable Design," Computer Science Press, pp. 501–510 (1990).

Kim et al., "Automatic Insertion of BIST Hardware Using VHDL," 25th ACM/IEEE Design Automation Conference, IEEE, pp. 9–15 (1988).

* cited by examiner

Primary Examiner—Albert Decady
Assistant Examiner—Joseph D. Torres
(74) Attorney, Agent, or Firm—Robert L. King; Kim-Marie Vo (57) ABSTRACT

A configurable test access mechanism has a sliced input wrapper, output wrapper and scan configuration wrapper coupled to a circuit under test. The input wrapper efficiently adds a PRPG (pseudo-random pattern generator) function to a scan test structure without impacting speed and power requirements. The output wrapper efficiently adds a MISR (multiple input signature register) functionality for additional test purposes to implement a built-in self-test (BIST) apparatus. Use of existing scan structures to implement the PRPG and MISR functions provides significant savings of circuitry. Variability of test polynomials is easily user programmed.

19 Claims, 5 Drawing Sheets

TEST ACCESS MECHANISM FOR SUPPORTING A CONFIGURABLE BUILT-IN SELF-TEST CIRCUIT AND METHOD THEREOF

FIELD OF THE INVENTION

This invention relates generally to integrated circuits, and more specifically, to testing the functionality of integrated circuits.

BACKGROUND OF THE INVENTION

Integrated circuits are frequently referred to as being a "system on a chip". Such devices are manufactured and designed to contain embedded core data processor wherein the embedded core communicates with peripherals, memory, or other circuitry on the same substrate. The embedded core may be designed and/or provided by a first group of individuals who license the embedded core to a second group of individuals who complete the system on a chip with their design arranged to interface with the embedded core. Therefore, testing of integrated circuits is made increasingly difficult due to differing design and test methodologies.

The embedded core, which is only a portion of the total integrated circuit, typically contains a plurality of input and output terminals. If the embedded core is kept as a separate structure during test pattern generation and is not bundled together with the rest of the integrated circuit logic for test pattern generation, then there is an access problem related to the plurality of input and output terminals of the embedded core. In most cases, there is no direct access to the embedded core for providing test vectors or for other test purposes.

One of the primary challenges in test and design-for-test (DFT) is the reduction of total test cost. There are many attributes to the test cost including the cost of tester equipment, test time and the space overhead associated with making an integrated circuit testable. As the number of transistors on an integrated circuit increases, so does the number of test vectors that are required to test the integrated circuit. An increase in test vector volume therefore increases test time as well as the requirement on test equipment memories. Together these factors negatively impact the cost of test. As designs increase in complexity, the impact for non-functional logic (i.e. logic dedicated for test purposes) remains high and undesirable. In addition to these problems, additional challenges include increased test power. When testing integrated circuits, circuits typically generate much more power than ever generated during a normal operational mode.

One solution that has been adapted in the industry to address some of the above problems is the use of Logic Built-In-Self-Test (LBIST) that is the ability of a circuit to test itself. The idea behind LBIST is to have both a pattern generator and a response analyzer on the integrated circuit. The use of a pattern generator reduces the volume of required external test vectors that reduces required tester memory. In addition, LBIST circuitry can remove problems associated with test accessibility, especially with embedded cores.

There are several different test architectures that support LBIST. One architecture is known as Self-Testing Using MISR and Parallel PRPG (Pseudo-Random Pattern Generator), or STUMPS. This architecture applies predetermined pseudo-random data through scan chains as test data to implement various tests. MISR is an acronym for Multiple Input Signature Register and is a Linear Feedback Shift Register (LFSR) configured as a signature analyzer that allows multiple data input ports to provide test data to be observed and compressed. There are commercially available software tools that support the STUMPS architecture. Attributes of the STUMPS architecture include centralized and separate BIST architecture, multiple scan paths and no boundary scan. A STUMPS architecture is only capable of testing (observing a response from) a circuit under test once per each scan load/unload. Most test architectures can only test either per scan load/unload or per clock and not both. For the STUMPS architecture, once a test polynomial for either the PRPG or MISR is chosen, it is fixed throughout the test. Unfortunately, a fixed polynomial leaves the circuit under test with many random-pattern-resistant faults requiring special care for handling.

Another test architecture is known as the BILBO (Built-In Logic Block Observer) architecture. The BILBO architecture is a "test per clock" architecture. That is, a new test pattern is applied and results observed on every clock. This architecture is characterized by test registers in a specific configuration that are inserted into the circuit structure at appropriate places. Predetermined pseudo-random test information is presented to the circuit under test and clocked through the circuitry to determine if an expected result is provided. The test determines whether the circuitry receiving the test information is functional. A BILBO "test per clock" scheme often requires a higher hardware overhead than the STUMPS "test per scan" scheme.

Embedded semiconductor cores also utilize a test access mechanism or "wrapper" to provide control and observation access to a core in isolation of other circuits. A wrapper can be a conventional multiplexer or a plurality of storage elements that surround the core and through which inputs to the core and outputs from the core pass for test purposes. During normal functional operation (or normal mode of operation), the wrapper allows signals to cross from the customer-specified logic into the core unaltered, and similarly allows data to pass from the core to the customer-specific logic unaltered. Additionally, a test mode is provided whereby scanned sequential elements (the plurality of speed path test cells that create the 'wrapper') provide controllability points for core inputs that are capable of launching transitions into core inputs for speed path testing at-speed. In addition, the plurality of speed path test cells in the wrapper also provides storage for capturing and observing embedded core outputs when an output of the embedded core is speed path tested.

Known uses of BIST, whether in the BILBO architecture or in the STUMPS architecture, are not optimal for integrated circuits due to associated test costs. Cost issues associated with test arise whether the pin count of integrated circuits is large or small.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, the terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
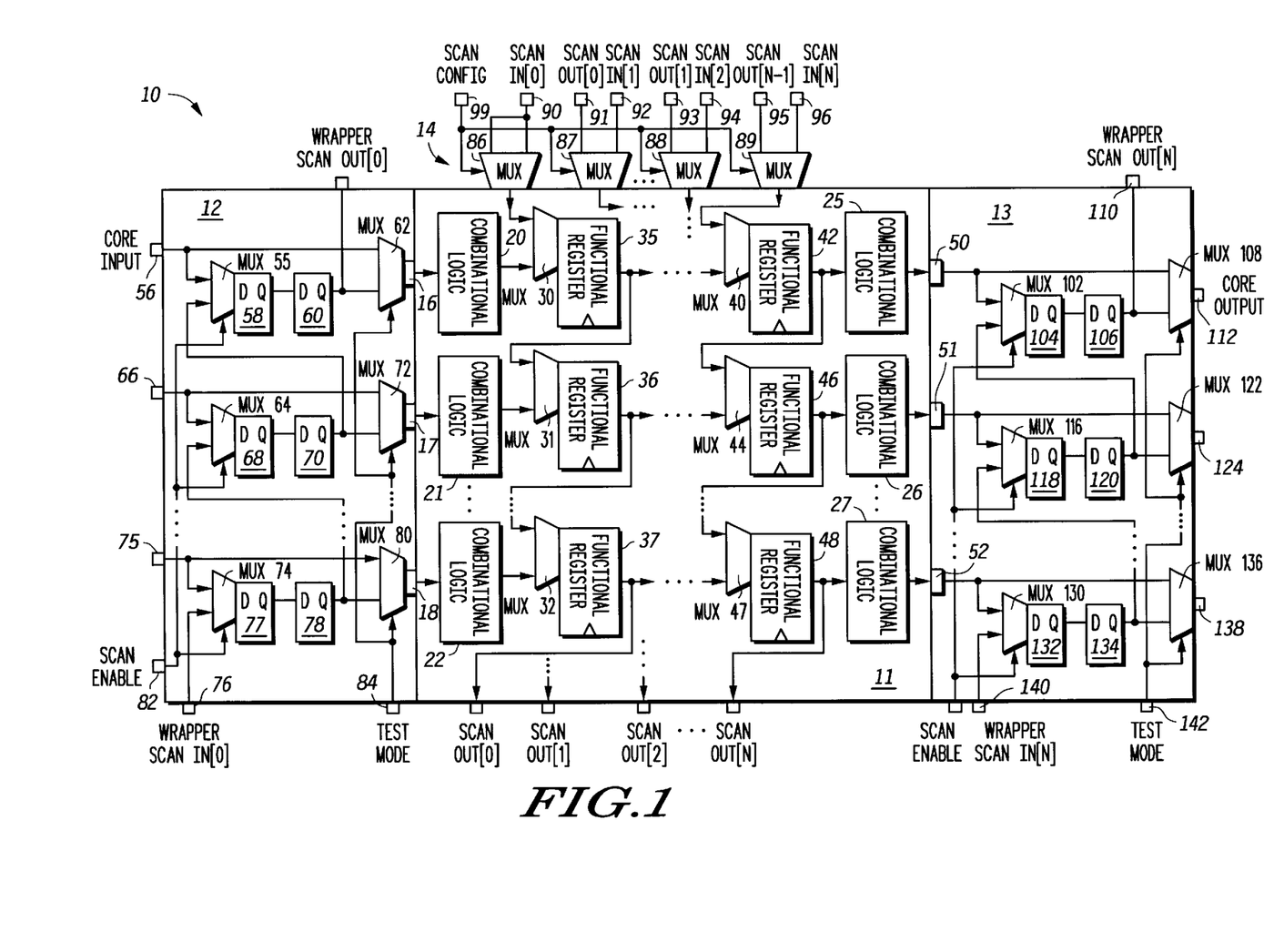
FIG. 1 illustrates in block diagram form an embedded core supporting a configurable scan chain architecture and a scan based test access mechanism.

FIG. 1 illustrates a circuit under test (CUT) 10 having an embedded core 11, and a wrapper having an input wrapper 12, an output wrapper 13 and a scan test configuration interface 14. Core 11 has a plurality of identified inputs 16, 17 and 18 and combinational logic sections such as combinational logic 20, 21, 22, 25, 26 and 27. Each combinational logic section has an input and an output. The input of combinational logic 20 is connected to input 16 and the output of combinational logic 20 is connected to a first input of a multiplexer (MUX) 30. An output of combinational logic 21 is connected to a first input of a multiplexer 31. An output of combinational logic 22 is connected to a first input of a multiplexer 32. Any number of intervening additional combinational logic sections may be placed between combinational logic 21 and combinational logic 22 as indicated by the dotted lines. An output of multiplexer 30 is connected to an input of a functional register 35. An output of functional register 35 is connected to a second input of multiplexer 31. An output of multiplexer 31 is connected to an input of a functional register 36. An output of functional register 36 is connected to a second input of multiplexer 32. An output of multiplexer 32 is connected to an input of a functional register 37. An output of functional register 37 is connected to a Scan Out [0] of core 11 and to other circuitry (not shown) of core 11. A first input of a multiplexer 40 is connected to either another core input (not shown) or to other combinational logic (not shown) or a combination of both. A second input of multiplexer 40 is connected to an output of a multiplexer 89 of scan test configuration interface 14. An output of multiplexer 40 is connected to an input of a functional register 42. An output of multiplexer 42 is connected to a first input of a multiplexer 44 and to an input of combinational logic 25. A second input of multiplexer 44 is connected to either another core input (not shown) or to other combinational logic (not shown) or a combination of both. An output of multiplexer 44 is connected to an input of a functional register 46. An output of functional register 46 is connected to other multiplexers and functional registers (not shown) similarly connected as indicated by the dotted line and to a first input of combinational logic 26. A first input of a multiplexer 47 is connected to an immediately prior stage output of a functional register. A second input of multiplexer 47 is connected to either another core input (not shown) or to other combinational logic (not shown) or a combination of both. An output of multiplexer 47 is connected to an input of a functional register 48. An output of functional register 48 is connected to an Nth Scan Out[N] output of core 11. Any number of intervening scan outputs, such as Scan Out[0], Scan Out[1], etc., may be implemented as illustrated in FIG. 1. An output of combinational logic 25 is connected to an output 50. An output of combinational logic 26 is connected to an output 51. An output of combinational logic 26 is connected to an output 52. Each of functional registers 35, 36, 37, 42, 46 and 48 has a clock input for receiving a system clock (not shown).

Input wrapper 12 has a multiplexer 55 having a first input connected to a core input 56 of Circuit Under Test 10 and an output connected to a D data input of a shift register 58. A Q data output of shift register 58 is connected to a D data input of a shift register 60. A Q data output of shift register 60 is connected to a first input of a multiplexer 62 and to a Wrapper Scan Out[0] output of Circuit Under Test 10. An output of multiplexer 62 is connected to input 16. A multiplexer 64 has a first input connected to a core input 66. An output of multiplexer 64 is connected to a D data input of a shift register 68. A Q data output of shift register 68 is connected to an input of a D data input of shift register 70. A Q data output of shift register 70 is connected to both a second input of multiplexer 55 and to a first input of a multiplexer 72. A second input of multiplexer 72 is connected to the core input 66. An output of multiplexer 72 is connected to input 17. A multiplexer 74 has a first input connected to a core input 75. A second input of multiplexer 74 is connected to a Wrapper Scan In[0] signal at a scan input terminal 76. An output of multiplexer 74 is connected to a D data input of shift register 77. A Q data output of shift register 77 is connected to a D data input of a shift register 78. A Q data output of shift register 78 is connected to both a second input of multiplexer 64 and to a first input of a multiplexer 80. A second input of multiplexer 80 is connected to the core input 75. An output of multiplexer 80 is connected to the input 18. A Scan Enable input 82 is connected to a control input of each of multiplexer 55, 64 and 74. A Test Mode 84 is connected to a control input of each of multiplexer 62, 72 and 80. It should be well understood that any number of intervening stages of the described multiplexer/shift register/multiplexer circuitry may be used in input wrapper 12 as illustrated by the dotted lines. Each of shift registers 58, 60, 68, 70, 77 and 78 is clocked by either a system clock (not shown) or a test clock (not shown).

Scan test configuration interface 14 has a plurality of N multiplexers, where N is an integer. In the illustrated form, multiplexers 86, 87, 88 and 89 are provided. Multiplexer 86 has both a first input and a second input connected to a scan input terminal 90 labeled Scan In[0]. A multiplexer 87 has a first input connected to a scan input terminal 91 labeled Scan Out[0] and a second input connected to a scan input terminal 92 labeled Scan In[1]. A multiplexer 88 has a first input connected to a scan input terminal 93 labeled Scan Out[1] and a second input connected to a scan input terminal 94 labeled Scan In[2]. A multiplexer 89 has a first input connected to a scan input terminal 95 labeled Scan Out[N−1] and a second input connected to a scan input terminal 96 labeled Scan In[N]. A scan configuration input terminal 99 is connected to a control input of each of multiplexers 86–89.

In the illustrated form, scan test configuration interface 14 is forming a single chain configuration. It should be well understood that scan test configuration interface 14 can readily be reconfigured to implement multiple scan chain configurations depending upon specific application requirements by using separate multiplexer control signals.

Output wrapper 13 has a multiplexer 102 having a first input connected to the output 50. An output of multiplexer 102 is connected to a D data input of a shift register 104. A Q data output of shift register 104 is connected to a D data input of a shift register 106. A Q data output of shift register 106 is connected to both a first input of a multiplexer 108 and to a Wrapper Scan Out[N] terminal 110 of circuit under test 10. A second input of multiplexer 108 is connected to the output 50. An output of multiplexer 108 is connected to a Core output 112. A multiplexer 116 has a first input connected to the output 51 and an output connected to a D data input of a shift register 118. A Q data output of shift register 118 is connected to a D data input of shift register 120. A Q data output of shift register 120 is connected to a first input of a multiplexer 122 and to a second input of multiplexer 102. A second input of multiplexer 122 is connected to output 51 of core 11. An output of multiplexer 122 is connected to a Core output 124. A multiplexer 130 has a first input connected to output 52, a second input connected to a Wrapper Scan In[N] 140, and an output connected to a D data input of a shift register 132. A Q data output of shift register 132 is connected to a D data input of shift register 134. A Q data output of shift register 134 is connected, in one form, to a second input of multiplexer 116 and to a first input of a multiplexer 136. A second input of multiplexer 136 is connected to output 52. An output of multiplexer 136 is connected to output 138. A Test Mode input 142 is connected to a control input of each of multiplexers 108, 122 and 136. A Scan Enable input 144 is connected to a control input of each of multiplexers 102, 116 and 130. Any number of intervening stages of similarly connected multiplexers/shift registers may be used in output wrapper 13 as is illustrated by the intervening dotted lines. Each of shift registers 104, 106, 118, 120, 132 and 134 is clocked by a system clock (not shown) or a test clock (not shown). It should be understood that inputs 56, 66, 75, 82 and the various scan inputs may be implemented as pins to an integrated circuit but will often only be terminals for connecting peripheral devices (not shown) to the terminals. Similarly, outputs 112, 124 and 138 and the various scan outputs may be implemented as pins to an integrated circuit but will often only be terminals for connecting peripheral devices (not shown) to the terminals.

In operation, input wrapper 12, output wrapper 13 and scan test configuration interface 14 form a semiconductor platform that provides an efficient test access mechanism to a designed circuit, such as core 11, that can be readily and efficiently tested. Core 11 contains a variety of combinational logic sections that form the functioning circuitry required to implement a processing core. It is this combinational logic, such as combinational logic 20, etc., that is required to be tested for operating functionality after manufacturing has occurred. Various tests may be performed with BIST circuitry including determining whether transistors are properly switching from a conductive to a non-conductive state, and vice versa, as well as whether the proper signal transitioning timing is being met. Input wrapper 12 functions to allow data provided at the core inputs such as core inputs 56, 66 and 75 to pass directly through input wrapper and to core 11. In the functional mode of operation, the Test mode signal at test mode input 84 functions to control multiplexers 62, 72 and 80 to directly pass the core input information to core 11 at the inputs 16, 17 and 18. When input wrapper 12 enters the test mode, two types of testing may be performed. Externally supplied test data may be presented to the core inputs 56, 66 and 75 and clocked through core 11 to determine if ultimately a predetermined expected output for the test input is obtained. In this test mode, the test data passes through input wrapper 12 in the same manner as functional data would. A second test mode involves scanning data through input wrapper 12 to verify that input wrapper 12 is functioning properly. Test data for scanning may be entered into input wrapper 12 either serially or in parallel. When scanning is begun, the Scan Enable signal is asserted at Scan Enable input 82. The Scan Enable signal enables multiplexer 55, 64 and 74 to select one of their two inputs. If serial scan is enabled, data is serially input into scan input terminal 76 and sequentially serially clocked through shift registers 77, 78, 68, 70, 58 and 60 to the Wrapper Scan output. Additionally, this scan test data may be gated by multiplexers 62, 72 and 80 and provided to core 11 for processing. Therefore, although the primary purpose of input wrapper 12 is to test core 11, the input wrapper 12 is also capable of testing itself.

When test data or functional data is presented to any particular combinational logic section of core 11, the data is processed by the combinational logic regardless of whether the data is for test or actual operating reasons. The output of the processing is then coupled to an associated functional register for storing, except for the combinational logic connected to an output that is observed directly using output wrapper 13. A system clock is used to control the timing of routing the data from the output of the functional register to external to core 11 for test analysis and to other circuitry (not shown) within core 11 for further functional processing according to the design of the core.

At certain outputs of core 11 there is connected the output of predetermined combinational logic sections, such as combination logic 25–27. Combinational logic 25–27 may process either test data or normal operating data and pass the information directly to output wrapper 13. Output wrapper 13 functions in either a test mode or a normal mode according to the Test Mode signal. In the normal mode, data may be directly connected from the outputs 50–52 to the Core outputs 112, 123 and 138, respectively. When the Test Mode is active and Scan Enable is not active, information is loaded through output wrapper 13 via the shift registers and output to the core outputs. For example, data from output 50 is routed by multiplexer 102 into shift registers 104 and 106 and output by multiplexer 108 under control of the Test Mode signal. If scan enable is active and the test mode is active, data is scanned into output wrapper 13 via the Wrapper Scan In[N] 140 and clocked serially through shift registers 132, 134, 118, 120, 104, 106 and out the Wrapper Scan Out[N] terminal 110. If desired, rather than serially inputting the scan information, the scan information may also come from core 11 under control of multiplexers 102, 116 and 130. If also desired, rather than serially outputting the scan information, the scan information may be output in parallel to the core outputs 112, 124 and 138 under control of multiplexers 108, 122 and 136, respectively.

Scan test configuration interface 14 functions to configure the number and length of scan chains to be used for testing core 11. In this test mode, data is serially scanned into core 11 in parallel to various functional registers via multiplexers. Once initially loaded, the functional shift registers are clocked by the system clock (not shown) and data is serially moved through core 11 and provided at the Scan output terminals. Additionally as illustrated, in the Nth stage of scan test configuration interface 14, scan test data may be loaded into functional registers 42, 46 and 48, passed through combinational logic 25–27, respectively, and output to outputs 50–52, respectively. The Scan Configuration signal provided at input terminal 99 controls whether each of multiplexers 87, 88, etc. to 89 outputs a scan input signal or an immediately lower ranked scan output signal. If desired, the Scan Out[0] signal from the output of Functional Register 37 which is connected to the first input of multiplexer 87 may be output by multiplexer 87. Note that the scan configuration signal 99 may be implemented as separate multiplexer control signals so that the scan chains may be configured or concatenated to various lengths and to be various scan chains. For example, thirty-two (or higher) scan chains in the widest possible configuration may be reduced to sixteen, eight, four, two or one scan chain. In this manner, a continuous serial scan chain may be implemented through core 11, wherein the scan outputs are connected via the scan configuration interface 14 to further functional registers within core 11 or the scan outputs may be provided to the outputs of the circuit under test 10 for observation. In this manner, all the functional registers of core 11 may be tested via the scan test and scan test configuration interface 14.

Therefore, circuit under test 10 provides a scan test mechanism having wrappers 12 and 13. Wrappers 12 and 13 both isolate and provide access to core 11. Wrappers 12 and 13 are known as "slice" wrappers in that each is added onto core 11 and is in a separate hierarchy from core 11. Scan configuration interface 14 is an added-on structure for implementing scan path configuration for core 11.

Figure 2:
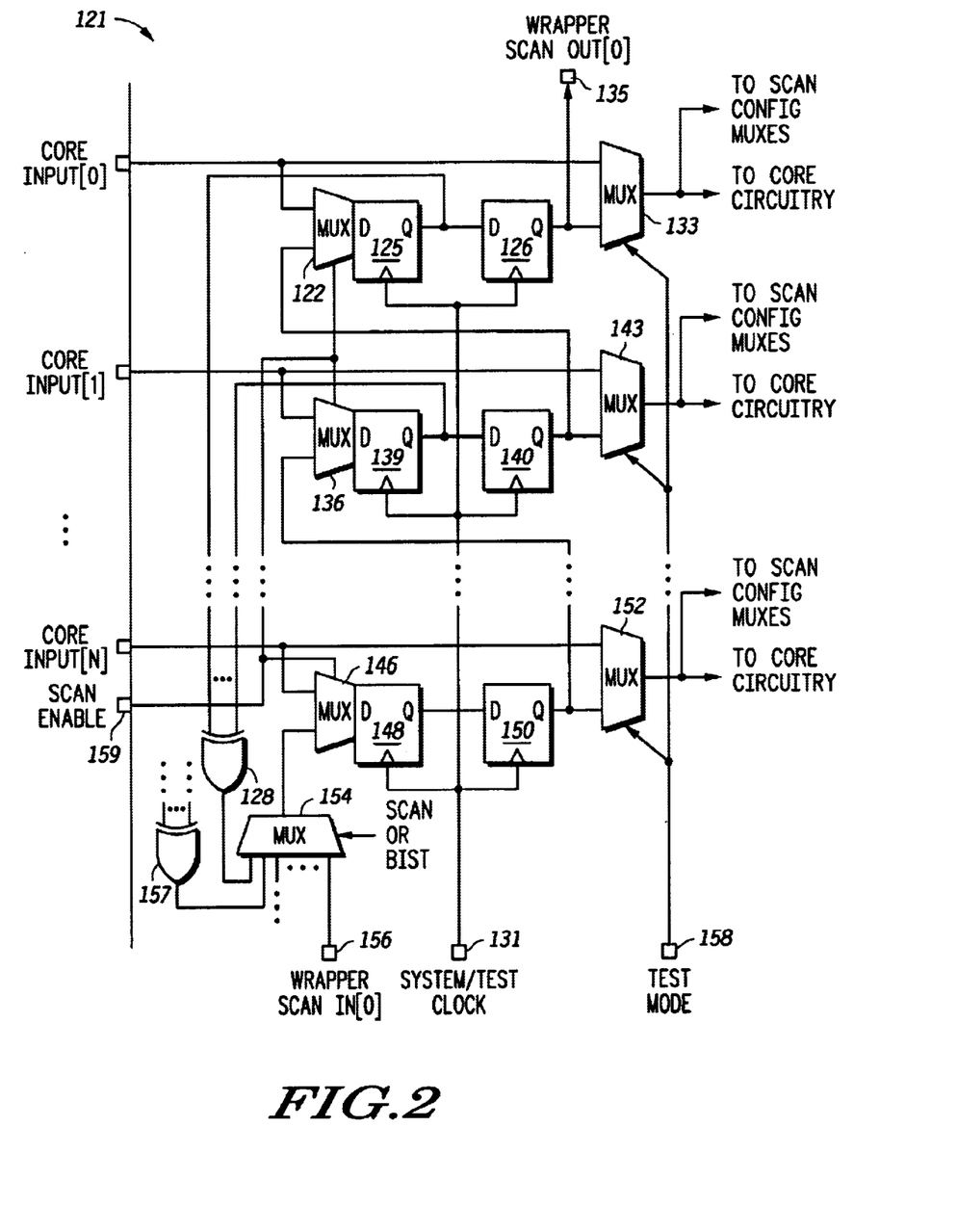
FIG. 2 illustrates in block diagram form an input portion of a test access mechanism for supporting configurable BIST circuitry in accordance with the present invention.

Illustrated in FIG. 2 is an input wrapper 121 in accordance with the present invention. An exemplary circuit under test is assumed to be an embedded core but can be any type of circuit under test. The illustrated circuit under test has a predetermined number of core inputs, such as Core Input [0], Core Input[1], etc. through Core Input[N] as denoted by the dotted lines. A multiplexer 122 has a first input connected to the Core Input[0], a second input, and an output connected to a D data input of a shift register 125. A Q data output of shift register 125 is connected to both a D data input of a shift register 126 and a first input of an exclusive OR gate 128. A clock input of each of shift register 125 and shift register 126 is connected to a System/Test Clock signal at a clock signal input 131. A Q data output of shift register 126 is connected to a first input of a multiplexer 133 and to a Wrapper Scan Out[0] terminal 135. A second input of multiplexer 133 is connected to the Core Input[0] input. An output of multiplexer 133 is connected to predetermined core circuitry (not shown) and to scan configuration (config) multiplexers (muxes) that are also not shown. A multiplexer 136 has a first input connected to the Core Input[1], a second input, and an output connected to a D data input of a shift register 139. A Q data output of shift register 139 is connected to both a D data input of a shift register 140 and a second input of exclusive OR gate 128. A clock input of each of shift register 139 and shift register 140 is connected to a System/Test Clock signal at the clock signal input 131. A Q data output of shift register 140 is connected to a first input of a multiplexer 143 and to the second input of multiplexer 122. A second input of multiplexer 143 is connected to the Core Input[1] input. An output of multiplexer 143 is connected to predetermined core circuitry (not shown) and to scan configuration (config) multiplexers (muxes) that are also not shown. Any number of additional stages of multiplexers and shift registers similarly connected may be included as indicated in FIG. 2 with the repeating dots before a final section N is provided. A multiplexer 146 has a first input connected to the Core Input[N], a second input, and an output connected to a D data input of a shift register 148. A Q data output of shift register 148 is connected to a D data input of a shift register 150. A clock input of each of shift register 148 and shift register 150 is connected to the System/Test Clock signal at a clock signal input 131. A Q data output of shift register 150 is connected to a first input of a multiplexer 152 and to the second input of multiplexer 136. A second input of multiplexer 152 is connected to the Core Input[N] input. An output of multiplexer 152 is connected to predetermined core circuitry (not shown) and to scan configuration (config) multiplexers (muxes) that are also not shown. A multiplexer 154 has a first input connected to an output of exclusive OR gate 128, and a second input connected to a Wrapper Scan In[0] signal 156. An output of multiplexer 154 is connected to a second input of multiplexer 146. A control input of multiplexer 154 is connected to a Scan or BIST control signal. A Test Mode input 158 for receiving a Test Mode signal is connected to a control input of each of multiplexers 133, 143 and 152. A Scan Enable input 159 for receiving a Scan Enable signal is connected to a control input of each of multiplexers 146, 136 and 122. Additional exclusive OR gates, such as exclusive OR gate 157 may be provided and connected to additional inputs of multiplexer 154. Exclusive OR gate 157 has at least two inputs, and has an output connected to an additional input of multiplexer 154. Each input of exclusive OR gate 157 is connected to a predetermined data node within input wrapper 121 or other sections (not shown) of the input wrapper 121 in accordance with a predetermined polynomial being implemented by each exclusive OR gate.

In operation, input wrapper 121 provides even more flexibility and test accessibility than input wrapper 12 of FIG. 1. Input wrapper 121 has the same functionality as input wrapper 12 of FIG. 1 and therefore duplicative functions will not be repeated. In addition to the functionality of input wrapper 12, input wrapper 121 uses logic circuitry, such as exclusive OR gate 128 and multiplexer 154 by way of example only, to incorporate PRPG functionality into the test access mechanism with minimal additional circuitry. In particular, Pseudo Random Pattern Generation (PRPG) is implemented inside of input wrapper 121. By connecting the outputs of certain predetermined shift registers in some or all bit paths, such as shift registers 125, 139, etc., to a feedback mechanism in the form of exclusive OR gate 128 and multiplexer 154, the functionality of PRPG can be created. It should be noted that FIG. 2 is exemplary only. For example, feedback from other shift registers than the specific shift registers chosen in FIG. 2 may be used. Additionally, multiple logic gates, such as exclusive OR gate 128 may be used. Other logic functions in addition to a logical exclusive OR may be used to implement a desired feedback polynomial or polynomials. The illustrated example is one implementation of a pattern generation function used to test core 11. It could just as easily also be configured to be a multiple input signature register (MISR) to test other circuitry (not shown) that drives logic values into the Core Inputs[0] through [N]. In this way, input wrapper 121 functions to dually serve the purposes of a scan test wrapper as well as a logic BIST (LBIST). The use of exclusive OR gate 128 and multiplexer 154 along with the particular shift register outputs which are selected implements a desired polynomial function for the linear feedback shift register (LFSR). As the digital bit values that are input into the scan portion of multiplexers 122, 136 and 146 vary, use of such values when combined into a logical exclusive OR function serves to implement somewhat (i.e. pseudo) random digital values. The output of exclusive OR gate 128 can be directly put into the scan chain of input wrapper 121 when multiplexer 154 receives the BIST signal. The Scan Enable control signal must also be active. In this manner, a conventional BIST test may be run with random patterns without dedicating a separate hardware random pattern generator. The BIST output may be scanned out via the Wrapper Scan output terminal or may be connected to scan configuration multiplexers in the scan wrapper or may be directly connected to the core. These three functions have been combined into a single scan input wrapper structure. The random numbers created by the BIST generator in input wrapper 121 may be used to test the structure of core 11 and to test interface timing and timing parameters of core 11.

It should be noted that the provision for the BIST function in the input wrapper 121 has not impacted the critical speed path from the core input to the core output. In particular, all additional connections associated with implementing a predetermined feedback polynomial are outside of the functional paths used to clock data or test vectors into core 11. Additionally, the structures that are used to implement the BIST are structures that were already present and used to implement the scan test portion of the input wrapper. A BIST has therefore been provided using minimal additional hardware and power requirements. Note that when a user is not using input wrapper 121 to test, the system or test clock applied may be stopped and each of the scan test wrapper and the BIST function use no power. Note that a typical input wrapper may be hundreds or thousands of bits long and therefore structures such as exclusive OR 128 and multiplexer 154 may be replicated several times to maintain a reasonable number of Inputs to each exclusive OR gate and associated required clock cycles. It must be further noted that additional logic similar to multiplexer 154 and exclusive OR gate 128 may be used to implement configurable (i.e. user alterable) multiple polynomials requiring different feedback inputs. For example, various polynomials may be provided for user selection as well as a polynomial of differing bit lengths may be implemented for debug flexibility. Given a 500-bit long scan input wrapper, this may be configured to be one 500-bit long PRPG or ten 50-bit long PRPGs and each PRPG may implement a different selected polynomial.

Another feature associated with the test access mechanism illustrated in FIG. 2 is that additional exclusive OR gates may be provided to implement other polynomial functions for the PRPG. Each polynomial has a predetermined order. For example, an example of a fourth order polynomial is: $X^4+X+1$. Another example of a fourth order polynomial is: $X^4+X^3+1$. By using multiple exclusive OR gates taking feedback from different shift register outputs, differing polynomials of the same order may be implemented. Additionally, other polynomials of different order may be implemented with other exclusive OR gates (not shown for simplicity of illustration). For each implemented polynomial, an additional input to multiplexer 154 is required. The BIST control signal would be implemented with enough bits to select each of the plurality of polynomials that is implemented through the use of feedback paths. As a result, a configurable test access mechanism is hereby provided which provides great programming test flexibility and the ability to use many variable test polynomials.

Figure 3:
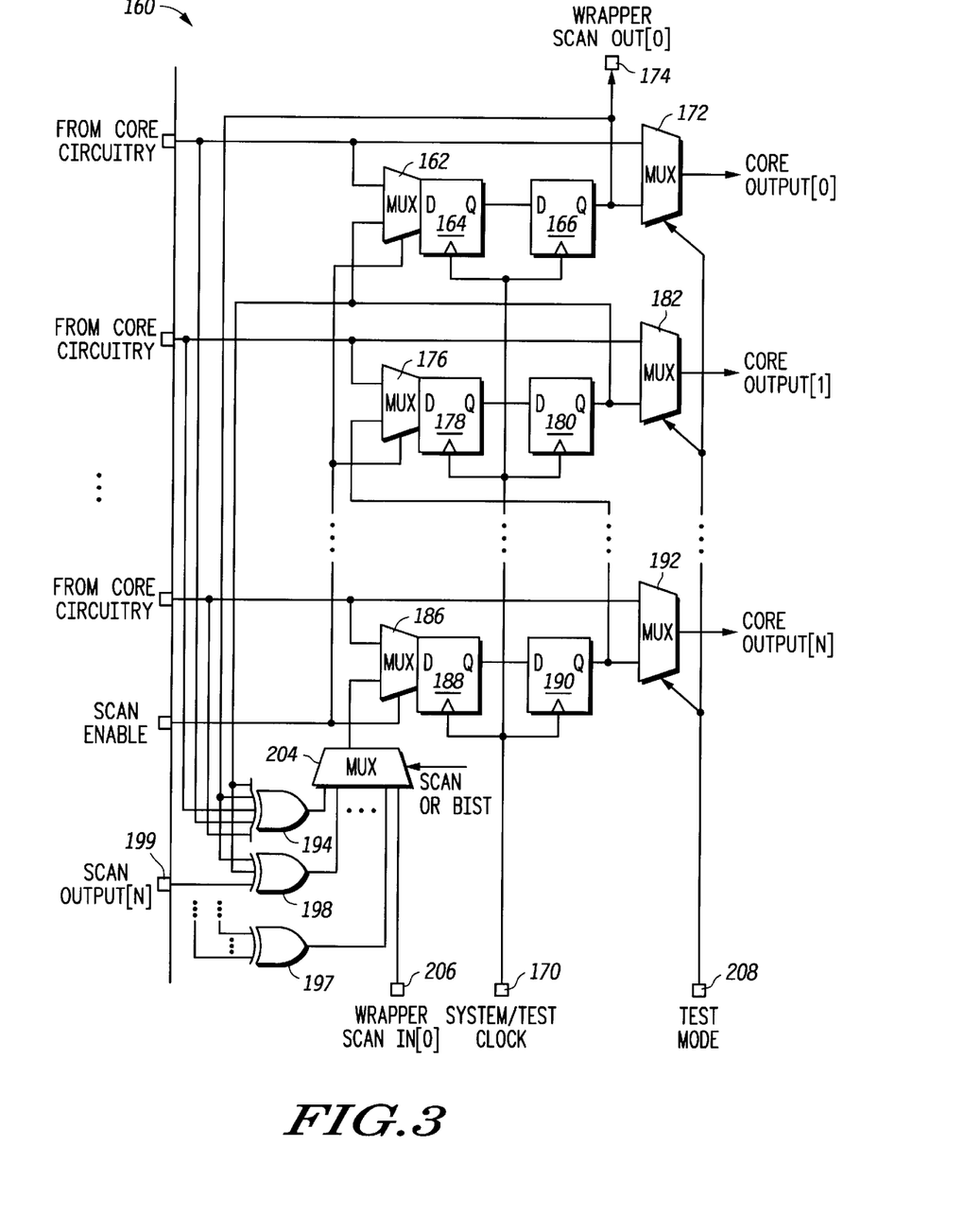
FIG. 3 illustrates in block diagram form an output portion of a test access mechanism for supporting configurable BIST circuitry in accordance with the present invention.

Illustrated in FIG. 3 is an output wrapper 160 in accordance with the present invention. Again, an exemplary circuit under test is assumed to be an embedded core but can be any type of circuit under test. The illustrated output wrapper 160 has a number of core outputs from core 11 as determined by the requirements of core 11. A multiplexer 162 has a first input connected from core 11 circuitry, a second input, and an output connected to a D data input of a shift register 164. A Q data output of shift register 164 is connected to a D data input of a shift register 166. A clock input of each of shift register 164 and shift register 166 is connected to a System/Test Clock signal at a clock signal input 170. A Q data output of shift register 166 is connected to a first input of a multiplexer 172 and to a Wrapper Scan Out[0] terminal 174. A second input of multiplexer 172 is connected to core 11 circuitry. An output of multiplexer 172 is connected to a Core Output[0] terminal. A multiplexer 176 has a first input connected from core 11 circuitry, a second input, and an output connected to a D data input of a shift register 178. A Q data output of shift register 178 is connected to a D data input of a shift register 180. A clock input of each of shift register 178 and shift register 180 is connected to a System/Test Clock signal at the clock signal input 170. A Q data output of shift register 180 is connected to a first input of a multiplexer 182, to the second input of multiplexer 162, to a first input of an exclusive OR gate 194 and to a first input of an exclusive OR gate 198. A second input of multiplexer 182 is connected from core 11 circuitry. An output of multiplexer 182 is connected to a Core Output [1] terminal. Any number of additional stages of multiplexers and shift registers similarly connected may be included as indicated in FIG. 3 with the repeating dots before a final section N is provided. A multiplexer 186 has a first input connected to core 11 circuitry, a second input, and an output connected to a D data input of a shift register 188. A Q data output of shift register 188 is connected to a D data input of a shift register 190. A clock input of each of shift register 188 and shift register 190 is connected to the System/Test Clock signal at a clock signal input 170. A Q data output of shift register 190 is connected to a first input of a multiplexer 192 and to the second input of multiplexer 176. A second input of multiplexer 192 is connected to core 11 circuitry. An output of multiplexer 192 is connected to a Core Output[N] terminal. Exclusive OR gate 194 has a second input connected to the Q data output of shift register 166, third, fourth and fifth inputs connected to respective outputs from core 11 circuitry, and an output. Exclusive OR gate 198 has a second input connected to the output of shift register 166, a third input connected to a Scan Output[N] terminal 199, and an output. A multiplexer 204 has a first input connected to the output of exclusive OR gate 194, a second input connected to the output of exclusive OR gate 198, and a third input connected to a Wrapper Scan In[0] signal 206. An output of multiplexer 204 is connected to a second input of multiplexer 186. A control input of multiplexer 204 is connected to a Scan or BIST control signal. A Test Mode input 208 for receiving a Test Mode signal is connected to a control input of each of multiplexers 172, 182 and 192. A Scan Enable input for receiving the Scan Enable signal is connected to a control input of each of multiplexers 162, 176 and 186. Additional exclusive OR gates, such as exclusive OR gate 197, may optionally be provided. Each such exclusive OR gate implements a predetermined additional polynomial and is connected to an additional input of multiplexer 204. Exclusive OR gate 197 has at least two inputs, each of which is connected to a predetermined data node within output wrapper 160 or additional sections (not shown) of the output wrapper 160.

In operation, output wrapper 160 provides even more flexibility and test accessibility than output wrapper 13 of FIG. 1. Output wrapper 160 has the same functionality as output wrapper 13 of FIG. 1 and therefore duplicative functions will not be repeated. In addition to the functionality of output wrapper 13, output wrapper 160 uses logic circuitry, such as exclusive OR gate 194 and exclusive OR gate 198 by way of example only, to incorporate MISR (Multiple Input Signature Register) functionality into the test access mechanism with minimal additional circuitry. It should be understood that the illustrated output wrapper 160 is not a standard configuration for a MISR but rather is a Serial Input Signature Register (SISR); however, a MISR functionality is added to the output wrapper 13 and a standard MISR configuration can be readily implemented with additional exclusive OR gates (not shown). Signature verification is the capture of the output data stream and conversion to a test word that can be compared to an expected test word to indicate "pass" or "fail". Failing test words can be compared to an expected signature dictionary to assist with diagnosis. Signature analyzers are configured to receive data and to compress the data stream into a single binary word. Because the signature analyzer provided in wrapper 160 receives a parallel stream of data, it is a Multiple Input Signature Register (MISR). With the addition of exclusive OR gates 194, 198 and multiplexer 204, the output scan test wrapper 160 may be converted to a MISR structure. By connecting the outputs of certain predetermined shift registers in some or all bit paths, such as shift registers 166, 180, etc., to a feedback mechanism in the form of exclusive OR gates 194 or 198 and multiplexer 204, the functionality of a MISR can be created. It should be noted that FIG. 3 is exemplary only. For example, feedback from other shift registers than the specific shift registers chosen in FIG. 3 may be used. Additionally, multiple logic gates, such as exclusive OR gates 194 and 198 may be used. Other logic functions in addition to a logical exclusive OR may be used to implement a desired feedback polynomial or polynomials. The illustrated example is one implementation of a signature analysis function used to test core 11. It could just as easily also be configured to be a pseudo random pattern generator (PRPG) to test other circuitry (not shown) that accepts logic values from the Core Outputs[0] through [N]. In this way, output wrapper 160 functions to dually serve the purposes of a scan test wrapper as well as a logic BIST (LBIST). The use of exclusive OR gates 194 and 198 and multiplexer 204 along with the particular shift register outputs which are selected implements a desired polynomial function for the linear feedback shift register (LFSR). As the digital bit values that are input into the scan portion of multiplexers 162, 176 and 186 vary, use of such values when combined into a logical exclusive OR function serves to compress the deterministic digital values. The outputs of exclusive OR gates 194 and 198 can be directly put into the scan chain of output wrapper 160 when multiplexer 204 receives the BIST signal. The Scan Enable control signal must also be active. In this manner, a conventional BIST test may be run with patterns arriving from the core 11 without dedicating a separate hardware MISR. The MISR output may be scanned out via the Wrapper Scan output terminal (or terminals) for observation. Additionally the MISR output may be provided through multiplexers 172, 182, 192, etc. for observation from the N core 11 outputs. The data provided to the MISR to be compressed or acted upon may source from core 11 circuitry through exclusive OR gates such as exclusive OR gate 194 or it may source from the scan outputs of core 11 circuitry through exclusive OR gates such as exclusive OR gate 198. The four functions [(1.) outputting at the wrapper scan output; (2.) outputting at the core outputs at the wrapper outputs; (3.) receiving scan test data from the core 11 circuitry; and (4.) receiving parallel or functional data or test data from the core 11 circuitry] have been combined into a single scan output wrapper structure. The deterministic values accepted by the signature analyzer in output wrapper 160 may be used to test the structure of core 11 and to test interface timing and timing parameters of core 11.

It should be noted that the provision for the BIST function in the output wrapper 160 has not impacted the critical speed path from the core input to the core output. In particular, all additional connections associated with implementing a predetermined feedback polynomial are outside of the functional paths used to clock data or test vectors from core 11. Additionally, the structures that are used to implement the BIST are structures that were already present and used to implement the scan test portion of the output wrapper. A BIST has therefore been provided using minimal additional hardware and power requirements. Note that when a user is not using output wrapper 160 to test, the system or test clock applied may be stopped and each of the scan test wrapper and the BIST function use no power. Note that a typical output wrapper may be hundreds or thousands of bits long and therefore structures such as exclusive OR gates 194 and 198 and multiplexer 204 may be replicated several times to maintain a reasonable number of inputs to each exclusive OR gate and associated required clock cycles. It must be further noted that additional logic similar to multiplexer 204 and exclusive OR gates 194 and 198 may be used to implement configurable (i.e. user alterable) multiple polynomials requiring different feedback inputs. For example, various polynomials may be provided for user selection as well as a polynomial of differing bit lengths may be implemented for debug flexibility. Given a 500-bit long scan output wrapper, this may be configured to be one 500-bit long MISR or ten 50-bit long MISRs and each MISR may implement a different selected polynomial.

Figure 4:
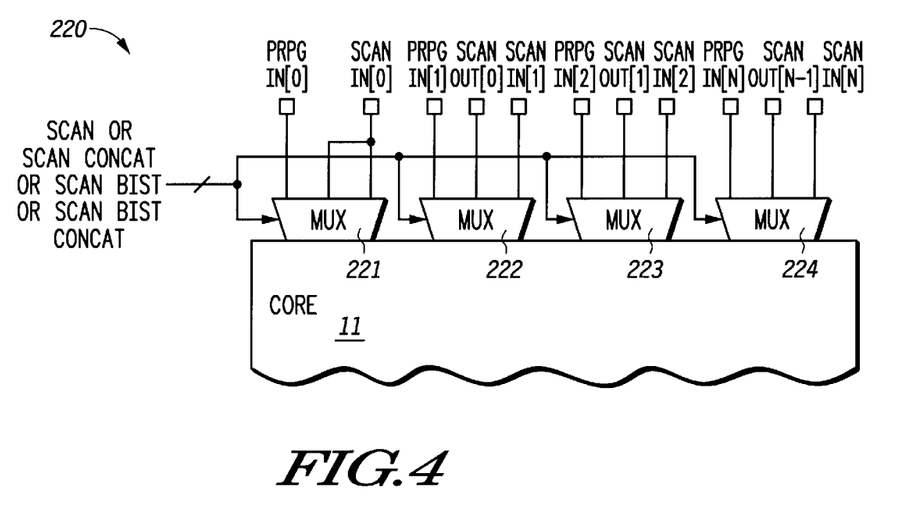
FIG. 4 illustrates in block diagram form scan test configuration circuitry in accordance with the present invention.

Illustrated in FIG. 4 is a configuration interface 220 of a scan wrapper in accordance with the present invention. In the exemplary form, configuration interface 220 has a plurality of three-input multiplexers, such as multiplexer 221, multiplexer 222, multiplexer 223 and multiplexer 224. It should be noted that other implementations may use any number of multiplexers. The number of multiplexers required should correlate to the number of scan configurations supported by core 11 (i.e. at most, 100 multiplexers for 100 scan chains). Each of multiplexers 221–224 has a control input for receiving a signal which functions as either a Scan signal, a Scan Concatentation (Concat) signal or a Scan BIST signal or a Scan BIST Concatentation (Concat). Multiplexer 221 has a first input for receiving a PRPG IN[0] signal where "PRPG" refers to Pseudo-Random Pattern Generation. A second input and a third input of multiplexer 221 are connected to a Scan In[0] signal. Multiplexer 222 has a first input connected to a PRPG IN[1] signal, a second input connected to a Scan Out[0] signal, and a third input connected to a Scan In[1] signal. Multiplexer 223 has a first input connected to a PRPG IN[2] signal, a second input connected to a Scan Out[1] signal, and a third input connected to a Scan In[2] signal. Multiplexer 224 has a first input connected to a PRPG IN[N] signal, a second input connected to a Scan Out[N] signal, and a third input connected to a Scan In[N] signal. Each of multiplexers 221–224 has an output for connection to a circuit under test, such as core 11 of FIG. 1, as illustrated in FIG. 1.

In operation, in a first test mode the configuration multiplexers 221–224 receive data on the Scan In ports, i.e., Scan In[0] through Scan In[N]. This is traditional scan testing. In a second test mode, the multiplexers 221–224 can selectively choose to apply scan-in data from the outputs of previous scan chains of either core 11 or the input or output wrappers. It should be noted that the wrappers may themselves support configuration multiplexers if they support multiple scan chains. The second test mode acts to reduce the number of scan chains by concatenating them into longer scan chains. This provides test flexibility during integration if the number of scan chains supported by core 11 exceeds the available outputs or pins on the final circuit under test. In a third test mode, the outputs of a PRPG function, such as that implemented in the input wrapper, may be applied to the scan configuration multiplexers 221–224. This third test mode provides a configurable scan BIST capability when used in conjunction with the input wrapper. To decrease the clock cycles required, i.e. the test time required, to test core 11, the BIST PRPG should be applied to the widest configuration of scan chains. Therefore, in supporting the BIST PRPG it would be preferable to support more scan chains than would normally be applied for a scan-only capability. In a fourth test mode, less than all of the outputs of a PRPG function, such as that implemented in the input wrapper, may be applied to the scan configuration multiplexers 221–224. This fourth test mode is implemented by the assertion of the "Scan BIST Concat" signal. In supporting the BIST PRPG it may be preferable to support fewer scan chains than would normally be applied for a scan-only capability. The "Scan BIST Concat" signal selectively enables only some (i.e. not all) of multiplexers 221–224 to uniquely configure only a portion of the scan chains in a concatenated manner. In addition, only some of the PRPG IN terminals receive an input from the source PRPG. For all four modes, it should be noted that the additional logic and capabilities of the scan configuration circuitry do not impact the functional operational paths of core 11. It should be appreciated that with the various inputs of each of multiplexers 221–224 and the various functions which the multiplexer control signals offer, many different scan configuration paths and many different sources of BIST or scan information may be readily configured with the test access mechanism.

Figure 5:
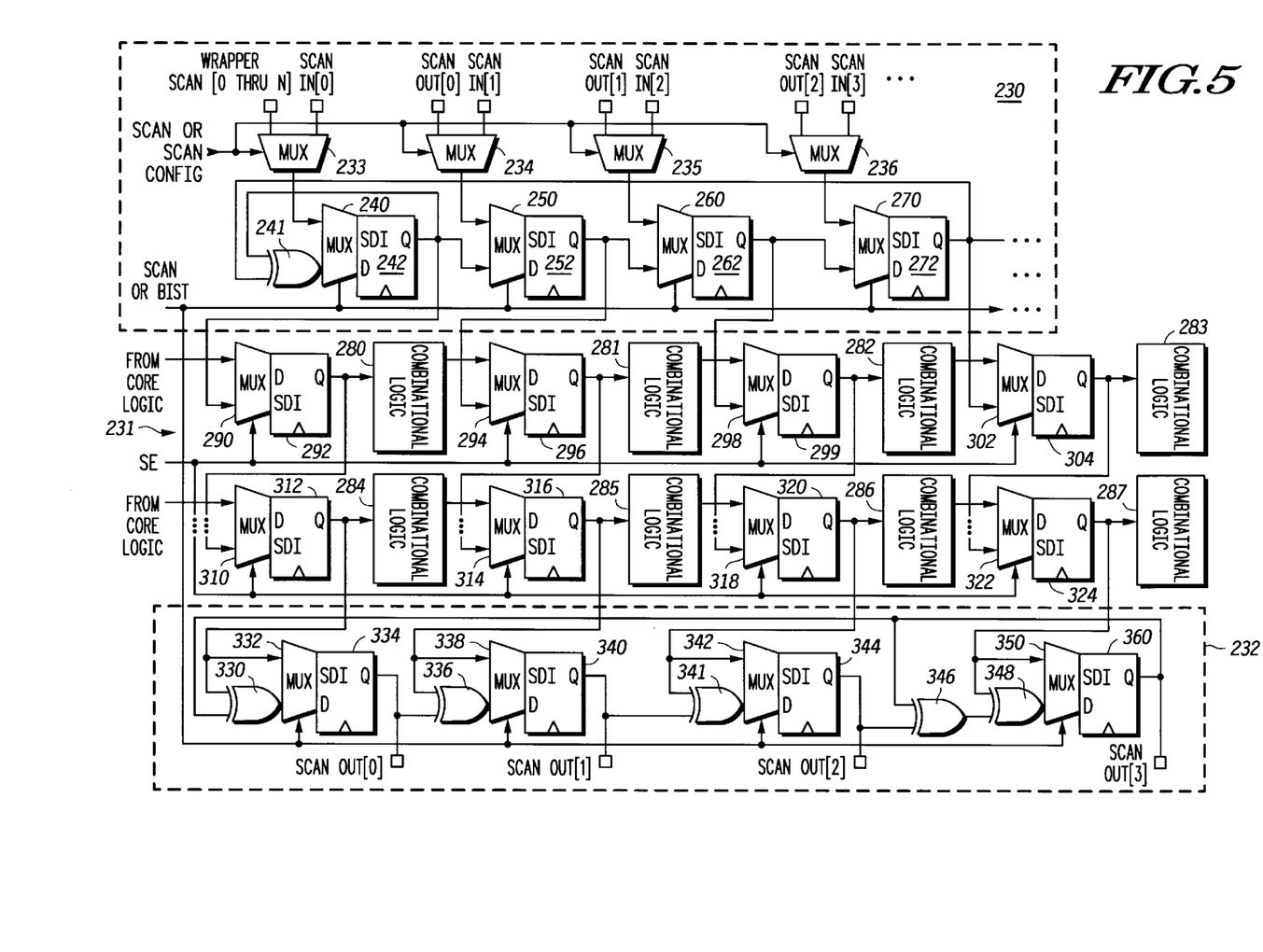
FIG. 5 illustrates in block diagram form scan test interface circuitry in accordance with the present invention.

Illustrated in FIG. 5 is an exemplary embodiment of a scan test interface and core logic. In the illustrated form, there is provided a scan configuration section 230, a core section 231 and a scan output section 232. Scan configuration section 230 has multiplexers 233–236. Multiplexer 233 has a first input for serially receiving Wrapper Scan bits 0 through N, SCAN[0 thru N]. A second input of multiplexer 233 receiving a first bit of a scan input signal, SCAN IN[0]. Multiplexer 234 has a first input for receiving a first bit of scan output data, SCAN OUT[0], from scan output section 232, and a second input for receiving a second bit of the scan input signal, SCAN IN[1]. Multiplexer 235 has a first input for receiving a second bit of scan output data, SCAN OUT[1], from scan output section 232, and a second input for receiving a third bit of the scan input signal, SCAN IN[2]. Multiplexer 236 has a first input for receiving a third bit of scan output data, SCAN OUT[2], from scan output section 232, and a second input for receiving a fourth bit of the scan input signal, SCAN IN[3]. It should be apparent from FIG. 5 that additional mutliplexers (not shown) associated with additional scan paths (not shown) through core section 231 may be implemented. Each of multiplexers 233–236 has a control input connected to a Scan Or Scan Configuration control signal. Each of multiplexers 240, 250, 260 and 270 has a control input connected to a Scan or BIST control signal. It should also be understood that the Wrapper Scan bits may be scanned into core section 231 in parallel rather than using only multiplexer 233. If the Wrapper Scan bits are input in parallel, other multiplexers (not shown), such as multiplexer 233 may be provided or the inputs of multiplexers 234–236 may be used for such information.

An output of multiplexer 233 is connected to a first input of a multiplexer 240 labeled SDI for Scan Data Input. Solely for convenience of illustration, the labels "SDI" and "D" are shown on the shift registers of FIG. 5 rather than on the multiplexer symbols. When operating in the normal data mode, the multiplexers are selected to pass the D data input to the D input of a respective shift register. When operating in a test scan mode, the multiplexers are selected to pass the SDI input to the D input of a respective shift register. A second input of multiplexer 240 labeled "D" is connected to an output of an exclusive OR gate 241. An output of multiplexer 240 is connected to a D data input of a shift register 242. A Q data output of shift register 242 is connected to a first input of exclusive OR gate 241 and to a first or D input of a multiplexer 250. A second or SDI input of multiplexer 250 is connected to an output of multiplexer 234. An output of multiplexer 250 is connected to a D data input of a shift register 252. A Q data output of shift register 252 is connected to a first or D input of a multiplexer 260. A second or SDI input of multiplexer 260 is connected to an output of multiplexer 235, and an output of multiplexer 260 is connected to a D data input of a shift register 262. A Q data output of shift register 262 is connected to a first or D input of a multiplexer 270. A second or SDI input of multiplexer 270 is connected to an output of multiplexer 236. An output of multiplexer 270 is connected to a D data input of a shift register 272. A Q data output of shift register 272 is similarly connected to additional multiplexer/shift register combinations (not shown).

The core section 231 has a plurality of combinational logic 280–287 implementing predetermined design functionality based upon the particular core. Each combinational logic unit has an associated multiplexer and shift register for test purposes. A multiplexer 290 has a first or D input for receiving data from other core logic, a second or SDI input connected to the Q data output of shift register 242, and an output connected to a D data input of a shift register 292. An output of shift register 292 is connected to combinational logic 280. An output of combinational logic 280 is connected to a first or D input of a multiplexer 294. A second or SDI input of multiplexer 294 is connected to the Q data output of shift register 252. An output of multiplexer 294 is connected to a D data input of a shift register 296. A Q data output of shift register 296 is connected to an input of combinational logic 281. An output of combinational logic 281 is connected to a first or D input of a multiplexer 298. A second or SDI input of multiplexer 298 is connected to the Q data output of shift register 262. An output of multiplexer 298 is connected to a D data input of shift register 299. A Q data output of shift register 299 is connected to an input of combinational logic 282. An output of combinational logic 282 is connected to a first or D input of multiplexer 302. A second or SDI input of multiplexer 302 is connected to the Q data output of shift register 272. An output of multiplexer 302 is connected to a D data input of shift register 304. A Q data output of shift register 304 is connected to an input of combinational logic 283. Additional row groupings of combinational logic units and associated multiplexer/shift register circuitry may be implemented as noted by the dots in the core section 231.

Within a final row grouping, combinational logic 284–287 is implemented. For purposes of explanation, the following description will assume that only the circuitry actually shown in FIG. 5 is implemented. A multiplexer 310 has a first or D input for receiving data from other core logic (not shown), a second or SDI input connected to the Q data output of shift register 292, and an output connected to a D data input of shift register 312. A Q data output of shift register 312 is connected to an input of combinational logic 284. An output of combinational logic 284 is connected to a first or D input of a multiplexer 314. A second or SDI input of multiplexer 314 is connected to a Q data output of shift register 296. An output of multiplexer 314 is connected to a D data input of shift register 316. A Q data output of shift register 316 is connected to an input of combinational logic 285. An output of combinational logic 285 is connected to a first or D input of a multiplexer 318. A second or SDI input of multiplexer 318 is connected to the Q data output of shift register 299, and an output of multiplexer 318 is connected to a D data input of a shift register 320. A Q data output of shift register 320 is connected to an input of combinational logic 286. An output of combinational logic 286 is connected to a first or D input of a multiplexer 322. A second or SDI input of multiplexer 322 is connected to the Q data output of shift register 304. An output of multiplexer 322 is connected to a D data input of a shift register 324. A Q data output of shift register 324 is connected to an input of combinational logic 287. Each of multiplexers 290, 294, 298, 302, 310, 314, 318 and 322 has a control input for receiving a Scan Enable (SE) control signal.

The scan output section 232 has exclusive OR gates 330, 336, 341, 346 and 348, multiplexers 332, 338, 342 and 350 and shift registers 334, 340, 344 and 360. Exclusive OR gate 330 has a first input connected to the Q data output of shift register 312, a second input connected to a Q data output of shift register 360, and an output connected to a first or D input of multiplexer 332. A second or SDI input of multiplexer 332 is connected to the Q data output of shift register 312. An output of multiplexer 332 is connected to a D data input of shift register 334. A Q data output of shift register 334 provides the first bit of the SCAN OUT signal, SCAN OUT[0], and is connected to a first input of an exclusive OR gate 336. A second input of exclusive OR gate 336 is connected to the Q data output of shift register 316. An output of exclusive OR gate 336 is connected to a first or D input of multiplexer 338. A second or SDI input of multiplexer 338 is connected to the Q data output of shift register 316. An output of multiplexer 338 is connected to a D data input of shift register 340. A Q data output of shift register 340 provides the second bit of the SCAN OUT signal, SCAN OUT[1], and is connected to a first input of an exclusive OR gate 341. A second input of exclusive OR gate 341 is connected to the Q data output of shift register 320, and an output of exclusive OR gate 341 is connected to a first or D input of multiplexer 342. A second or SDI input of multiplexer 342 is connected to the Q data output of shift register 320. An output of multiplexer 342 is connected to a D data input of shift register 344. A Q data output of shift register 344 provides the third bit of the SCAN OUT signal, SCAN OUT[3], and is connected to a first input of exclusive OR gate 346. A second input of exclusive OR gate 346 is connected to the Q data output of shift register 360. An output of exclusive OR gate 346 is connected to a first input of exclusive OR gate 348. A second input of exclusive OR gate 348 is connected to the Q data output of shift register 324, and an output of exclusive OR gate 348 is connected to a first or D input of multiplexer 350. A second or SDI input of multiplexer 350 is connected to the Q data output of shift register 324. An output of multiplexer 350 is connected to an SDI input of shift register 360. The Q data output of shift register 360 provides the fourth bit of the SCAN OUT signal, SCAN OUT[3]. Each of multiplexers 332, 338, 342 and 350 has a control input connected to the Scan or BIST control signal. Each of the illustrated shift registers of FIG. 5 has a clock input that is clocked by a System clock (not shown).

In operation, scan configuration section 230 functions to determine the scan inputs and therefore the scan paths to test within core section 231. When the scan enable signal is not active, data is clocked from a left-to-right direction within core section 231. The actual data paths during a normal mode of operation are dependent upon the specific core design. When the scan enable signal is active, the multiplexers 290, 294, 298, 302, 310, 314, 318 and 322 within core section 231 function to select scan test data being directed through core section 231 by scan configuration section 230. In one example, the "Scan or Burst" signal asserts a Scan operation. The Scan operation directs multiplexers 240, 250, 260 and 270 to respectively select the outputs of multiplexers 233–236 to scan into core section 231. The Scan operation signal also controls multiplexers 332, 338, 342 and 350 to select the outputs from core section 231. In this manner, a seed value is scanned into scan configuration section 230, core section 231 and scan output section 232. A scheduler (not shown) created using conventional logic circuitry is provided for controlling the timing of the assertion of the SE and the Scan or BIST signals. At the proper time, the scheduler causes the Scan or BIST signal to assert the BIST operation with the SE signal remaining asserted. In the BIST operation, the PRPG of scan configuration section 231 is activated by controlling multiplexers 240, 250, 260 and 270. The MISR of scan output section 232 is activated by controlling multiplexers 332, 338, 342 and 350 to respectively select the output of exclusive OR gates 330, 336, 341 and 348. The scheduling function properly times the number of system clocks required to capture the scanned in data and then places the operation back into the Scan operation. It should be well understood that the Scan or BIST signal may be implemented as either two distinct control signals or as a single signal. The specific operation of scanning and BIST operations (PRPG and MISR) is controlled by the scheduler and is entirely flexible depending upon what circuitry is being tested and what tests are desired.

The use of multiplexers 240, 250, 260 and 260 and shift registers 242, 252, 262 and 272 within scan configuration section 230 is provided for the purpose of synchronizing the scan data that is input to multiplexers 233–236 by synchronizing to the system or test clock used by core section 231 and scan output section 232. By synchronously clocking shift registers 242, 252, 262 and 272 with the system or test clock, the timing of the presentation and storage of the scan input data to scan configuration becomes less critical. Additionally, we have recognized that we can also add pseudo-random pattern generator (PRPG) functionality to the configured scan paths through logic section 231 using the same circuitry (multiplexers 240, 250, 260, 270 and shift registers 242, 252, 262, 272). The only additional circuitry required to implement a PRPG function to the scan configuration circuitry 230 is exclusive OR gate 241 which provides a pseudo-random input to multiplexer 240 by using the output of shift register 272 and the output of shift register 242. Other polynomials (not shown) may be implemented using additional inputs to exclusive OR gate 241 by using feedback from other shift registers of the data synchronizing function in scan configuration circuitry 230.

The use of multiplexers 332, 338, 342 and 350 and shift registers 334, 340, 344 and 360 within scan output section 232 is provided for the purpose of synchronizing the scan data that is input to multiplexers 332, 338, 342 and 350 by synchronizing to the system or test clock used by core section 231 and scan configuration section 230. By synchronously clocking shift registers 334, 340, 344 and 360 with the system or test clock, the timing of the presentation and storage of the scan output data becomes less critical.

Additionally, we have recognized that we can also add a multiple input signature register (MISR) functionality to the configured output scan paths of logic section 231 using the same circuitry (multiplexers 332, 338, 342 and 350 and shift registers 334, 340, 344 and 360) used for output scan synchronization. The only additional circuitry required to implement a MISR function to the scan output section 232 is exclusive OR gates 330, 336, 341 and 348. Other polynomials (not shown) may be implemented using additional inputs to exclusive OR gates 330, 336, 341 and 348 by using data inputs from other portions of the core section 231 than the ones shown in FIG. 5. It should be well understood that although a PRPG function is implemented in the head or scan input section 230 and a MISR function is implemented in the tail or scan output section 232, only one of the two functions may be implemented or the functionality may be reversed by using a MISR function in the head or scan input section 230 and a PRPG function in the tail or scan output section 232. It should also be well understood that the circuitry implementing the scan synchronization and MISR or PRPG functionality may be arranged in the portion of the circuit under test which is identified in FIG. 5 as the core portion 231. It should be also be well understood that the core section 231 may be viewed or understood to actually be multiple cores and that the same scan input section 230 and the same scan output section 232 are used for scanning data through multiple cores. Additionally, each scan path configured by scan input section 230 may be connected to multiple cores so that the same data is being scanned concurrently through multiple cores.

It should be noted that if there is no core logic being input to multiplexers 290 and 310, but rather input data is directly connected to multiplexers 290 and 310, then there is no need to have an input wrapper section such as input wrapper 12 of FIG. 1 if shift register 292 and shift register 312 are scanned separately with separate scan control (e.g. SE) than scan elements internal to core section 231. Similarly, if there is no combinational logic at the output such as combinational logic 282 and combinational logic 287, there is no requirement for an output wrapper such as output wrapper 13 of FIG. 1. On the input side, shift registers 292 and 312 can be configured to include either a PRPG or a MISR function by adding one or more exclusive OR gates and a multiplexer (not shown) between the Q data output of shift register 292 and the second input of multiplexer 310. This change would make shift registers 292 and 312, which are already scannable, have the additional functionality of a PRPG or a MISR as taught herein. As such, shift registers 292 and 312 function as a test wrapper if they are made separately directly scannable. On the output side, shift registers 304 and 324 would be modified to include one or more exclusive OR gates and a multiplexer (not shown) between the Q data output of shift register 304 and the second input of multiplexer 322. Shift registers 304 and 324 would be made separately directly scannable and function as an output wrapper. It should be noted that in this modified form, the modification of shift registers 292 and 312 to form an input wrapper would form a "shared" wrapper, whereas the input wrapper section of FIG. 2 is a "slice" wrapper. Similarly, the modification of shift registers 304 and 324 to form an output wrapper would form a "shared" wrapper, whereas the output wrapper section of FIG. 3 is a "slice" wrapper. Therefore, the test access mechanism taught herein readily applies to slice, shared and scan wrappers.

By now it should be appreciated that there has been provided an access mechanism architecture that serves the dual purpose of being a wrapper as well as a configurable logic BIST. If a circuit under test, such as a core, has an existing wrapper for scanning data, the wrapper can be expanded in functionality to implement a configurable pattern generator (i.e. a PRPG) at the inputs and response analyzer circuitry (i.e. a MISR) at the outputs to support self-test methodology. The present invention utilizes the existence of functional registers and other test logic that is otherwise present for the sole function of scanning data. All circuitry that is required to efficiently provide a test access mechanism with dual scan/PRPG and dual scan/MISR functionality is present only on the test paths; hence such circuitry does not have an effect on functional logic or functional paths. The test access mechanism taught herein has ease of configuration, ease of diagnostic and optimality of design. The test access mechanism can be implemented during design synthesis, or an external tool can be developed to insert the test access mechanism after a design is complete. The present invention provides a straight-forward method of obtaining access to internal circuitry in a design (whether in an integrated circuit or on a printed circuit board or card) where such internal circuitry is not directly accessible through external terminals or pins. The Logic Built-In Self-Test circuitry taught herein is configurable in a number of ways. Various polynomials may be implemented with minimal additional circuitry (typically one additional exclusive OR gate, one additional multiplexer input and unique control signal, and the conductors). Various test path configurations may be readily implemented to internal circuitry not readily accessible to an external user. As a result, a circuit under test utilizing the present invention requires a very low cost tester because the use of hundreds of external test vectors and many additional test connections to a tester are eliminated. The present invention also allows the use of flexible test scheduling to reduce test time. Additional test modules are not required to implement the configurable test access mechanism taught herein. An additional implementation of the test access device taught herein is the use of any combination of a PRPG and a MISR for test purposes. The test access mechanism taught herein may be implemented either in an integrated circuit or in a printed circuit board or card application.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, although exclusive OR gates are provided, various circuit implementations and components may be used to implement a logical exclusive OR function. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A test access mechanism for a circuit under test, the circuit under test having a functional portion to be tested, the functional portion implementing one or more predetermined circuit functions, the test access mechanism comprising:

a test portion coupled to the functional portion, the test portion having a plurality of inputs, each connected to a respective data path for receiving inputs to the circuit under test and coupling the data paths to respective inputs of the circuit under test in response to a first value of a test mode signal, the test portion being scannable to input predetermined test data at a scan input in response to a first value of a scan select signal and clock the predetermined test data through a scan path of the test portion, the predetermined test data being coupled to the circuit under test in response to a second value of the test mode signal, the test portion separately performing a built-in self-test in response to a second value of the scan select signal by using at least two feedback paths from predetermined points in the scan path and performing a predetermined logic function with one or more predetermined logic gates to provide to the circuit under test a series of built-in self-test data bits, the built-in self-test data bits are clocked through the scan path to provide test data to determine if transistors in the circuit under test are properly switching and to determine if correct signal transitioning timing is being met, the test portion using same shift register circuitry to implement scan path testing exclusive from built-in self-test and with commonly shared circuitry.

2. The test access mechanism of claim 1 wherein when the test mode signal has the first value and inputs to the circuit under test at the plurality of inputs are coupled to the respective inputs of the circuit under test, data provided to the plurality of inputs is provided at one or more scan outputs of the circuit under test.

3. The test access mechanism of claim 1 further comprising scan configuration circuitry coupled to the functional portion for selectively connecting a second plurality of inputs to predetermined functional registers of the functional portion for testing operation of the predetermined functional registers.

4. The test access mechanism of claim 3, wherein the scan configuration circuitry further comprises concatenated multiplexers used to serially connect multiple scan chains within the functional portion.

5. The test access mechanism of claim 4, wherein the concatenated multiplexers are further used to configure psuedo-random data.

6. The test access mechanism of claim 1 wherein the test portion has a test scan output terminal wherein the test data is output directly from the test portion for external analysis of operability of the test portion.

7. The test access mechanism of claim 1 wherein the test portion further comprises a multiplexer controlled by the scan select signal for selecting between test data to implement a pseudo-random pattern generator (PRPG) test and test data to implement scan path testing.

8. The test access mechanism of claim 1 wherein the one or more predetermined logic gates are one or more exclusive OR gates.

9. The test access mechanism of claim 1 further comprising logic circuitry for selectively routing the plurality of inputs through the scan path of the test portion in lieu of coupling the plurality of inputs to the circuit under test via the data paths.

10. The test access mechanism of claim 1 further comprising additional predetermined logic circuitry to implement test configurability by providing for selection of multiple polynomials for generating multiple pseudo-random pattern generator (PRPG) tests.

11. The test access mechanism of claim 10, wherein the multiple polynomials are different polynomials of a same order.

12. The test access mechanism of claim 1 wherein the test portion further comprises a multiplexer to make the test access mechanism configurable by selecting between multiple polynomials.

13. The test access mechanism of claim 1 wherein the test portion further comprises multiple logic gates having multiple inputs, each having an output coupled to a multiplexer for selecting between test data to implement a multiple input signature register (MISR) test.

14. The test access mechanism of claim 13 wherein the test data is further defined as scan input test data.

15. The test access mechanism of claim 13 wherein the test data is further defined as feedback test data.

16. The test access mechanism of claim 1 further comprising additional predetermined logic functions to implement multiple polynomials for generating a plurality of multiple input signature register (MISR) tests.

17. The test access mechanism of claim 16 wherein the multiple polynomials are different polynomials of a same order.

18. A circuit core having a test access mechanism for scan testing that comprises an input wrapper test access mechanism and an output wrapper test access mechanism coupled to the circuit core, each of the input wrapper test access mechanism and the output wrapper access mechanism comprising:

a plurality of inputs, each connected to a respective data path for receiving inputs and coupling the inputs directly to respective outputs in response to a first value of a test mode signal, a scan input to input predetermined test data in response to a first value of a scan select signal and clock the predetermined test data through a scan path, the predetermined test data being coupled to the respective outputs in response to a second value of the test mode signal, a built-in self-test being separately implemented in response to a second value of the scan select signal by using at least two feedback paths from predetermined points in the scan path and performing a predetermined logic function with one or more predetermined logic gates to provide to the respective outputs a series of built-in self-test data bits, the built-in self-test data bits being clocked through the scan path to provide test data to determine transistor functionality, same shift register circuitry being used to implement scan path testing exclusive from built-in self-test and with commonly shared circuitry.

19. A method of scan testing a circuit core comprising:

coupling an input wrapper test access mechanism to the circuit core;

receiving inputs at a plurality of input terminals of the input wrapper test access mechanism and directly coupling the inputs to respective outputs in response to a first value of a test mode signal;

scanning serial digital data at a scan input to input predetermined test data in response to a first value of a scan select signal and clocking the predetermined test data through a scan path, the predetermined test data being coupled to the respective outputs in response to a second value of the test mode signal; and providing a series of built-in self-test data bits for the circuit core in response to a second value of the scan select signal by using at least two feedback paths from predetermined points in the scan path and performing a predetermined logic function with one or more predetermined logic gates to provide to the respective outputs the series of built-in self-test data bits, the built-in self-test data bits being clocked through the scan path, wherein scan path test data is created exclusive from the built-in self-test data bits but with commonly shared circuitry.

* * * * *